(12) United States Patent
Langhorn

(10) Patent No.: US 6,965,168 B2
(45) Date of Patent: Nov. 15, 2005

(54) MICRO-MACHINED SEMICONDUCTOR PACKAGE

(75) Inventor: Jason Barnabas Langhorn, South Bend, IN (US)

(73) Assignee: CTS Corporation, Elkhart, IN (US)

( * ) Notice: Subject to any disclaimer, the term of this patent is extended or adjusted under 35 U.S.C. 154(b) by 0 days.

(21) Appl. No.: 10/082,955

(22) Filed: Feb. 26, 2002

(65) Prior Publication Data

US 2003/0160310 A1 Aug. 28, 2003

(51) Int. Cl.⁷ ............................................. H01L 23/48
(52) U.S. Cl. ...................... 257/778; 257/678; 257/737; 438/125
(58) Field of Search ................................ 257/678, 737, 257/778; 438/125

(56) References Cited

U.S. PATENT DOCUMENTS

| | | | |
|---|---|---|---|
| 5,291,062 A | | 3/1994 | Higgins, III |
| 5,571,363 A | | 11/1996 | Brosig et al. |
| 5,700,715 A | * | 12/1997 | Pasch ........................ 438/613 |
| 5,898,218 A | | 4/1999 | Hirose et al. |
| 5,907,187 A | | 5/1999 | Koiwa et al. |
| 6,214,644 B1 | * | 4/2001 | Glenn ........................ 438/108 |
| 6,225,692 B1 | | 5/2001 | Hinds |
| 6,400,009 B1 | * | 6/2002 | Bishop et al. ............... 257/704 |
| 6,441,481 B1 | * | 8/2002 | Karpman .................... 257/711 |
| 6,483,190 B1 | * | 11/2002 | Kainuma et al. ............ 257/737 |

FOREIGN PATENT DOCUMENTS

| | | |
|---|---|---|
| EP | 0735671 A1 | 10/1996 |
| EP | 1057779 A3 | 9/2002 |
| GB | 1057779 A2 * | 12/2000 ............ B81B/7/00 |
| JP | 7-318632 | 11/1995 |
| JP | 10-125822 | 5/1998 |
| WO | WO98/19349 | 8/1997 |

* cited by examiner

*Primary Examiner*—Eddie Lee
*Assistant Examiner*—Samuel A Gebremariam
(74) *Attorney, Agent, or Firm*—Mark P. Bourqeois; Daniel J. Deneufbourg

(57) ABSTRACT

A hermetic multi-layered ceramic semiconductor package for micro-machined semiconductor devices. The package has a substrate with top and bottom surfaces. A micro-machined semiconductor device is located adjacent to the top surface. Vias extend through the substrate between the surfaces. The micro-machined semiconductor device is electrically connected to the vias. A rigid support is located between the micro-machined semiconductor device and the top surface to support the micro-machined semiconductor device during assembly and to space the micro-machined semiconductor device from the top surface. Solder spheres are mounted to the bottom surface and are connected to the vias.

3 Claims, 4 Drawing Sheets

US 6,965,168 B2

MICRO-MACHINED SEMICONDUCTOR PACKAGE

BACKGROUND

1. Field of the Invention

This invention generally relates to ceramic electronic packaging. Specifically, there is a multilayered ceramic package having a cavity with structural supports that is bonded to a micro-machined semiconductor device.

2. Description of the Related Art

Various devices and techniques are used for packaging of micro-machined semiconductor devices. Typically, a micro-machined semiconductor die is fabricated with wirebond pads and a sealing structure. A silicon lid has a cavity etched therein using a strong acid such as hydrofluoric. The micro-machined semiconductor needs space within the package to allow the moving surfaces of the device to function properly. The silicon lid can be attached to the semiconductor die by an adhesive. The die and lid assembly is placed on a hybrid ceramic where the bond pads on the die are wirebonded to bond pads on the hybrid ceramic. The hybrid ceramic is then encapsulated within a hermetic package. This package has several problems. First, wire bonds are fragile and are subject to being torn away during mechanical assembly of the package. Second, the ceramic hybrid is expensive to produce. Third, if one of the parts in the hybrid circuit is defective, the whole circuit has to be thrown away. Previous attempts at packaging micro-machined semiconductor devices have encountered difficulties in producing reliable electrical connections and hermetic seals that will survive environmental stress and be economically manufactured.

Typical micro-machined semiconductor structures contain metal elements on their surfaces which cannot be passivated through traditional glass passivation processes, however they still must be hermetically sealed. Current techniques include "attaching" a silicon lid, which has a cavity etched into its underside to clear the micro-machined structure, to the surface of the die exposing only the bonding pads. This configuration accomplishes the hermetic seal but will not allow for flip chip processes to be used as the die I/O pads cannot be brought to the surface.

An example of a micro-machined semiconductor package is shown in U.S. Pat. No. 6,225,692 to Hinds. The contents of which are herein specifically incorporated by reference. U.S. Pat. No. 6,225,692 has a semiconductor device that is attached by reflowing solder paste or plating to a low temperature co-fired ceramic (LTCC) package. A hermetic seal is obtained by a solder seal ring that is also reflowed. While this design has advantages, one disadvantage is that it is difficult to control the dimensions of the distance between the micro-machined semiconductor device and the package substrate. When the solder reflows, it can spread out resulting in uneven solder heights. Another disadvantage is that forming the cavity adds additional cost and processing steps.

Despite the advantages of the prior art designs, none have combined a highly reliable package with a design that is readily manufacturable at a low cost.

SUMMARY

It is a feature of the invention to provide a hermetic multilayered ceramic package for a micro-machined semiconductor device.

A further feature of the invention is to provide a semiconductor package for a micro-machined semiconductor device. The package includes a substrate having a first surface and a second surface. The micro-machined semiconductor device is located adjacent the first surface. A plurality of vias extend through the substrate between the first and second surfaces. An electrical connection is located between the vias and the micro-machined semiconductor device for electrically connecting the vias to the semiconductor device. A seal is located between the micro-machined semiconductor device and the first surface to hermetically seal the micro-machined semiconductor device. A rigid support is located between the micro-machined semiconductor device and the first surface to support the micro-machined semiconductor device during assembly. Several solder spheres are mounted to the second surface and are electrically connected to the vias.

BRIEF DESCRIPTION OF THE DRAWINGS

These and other features of the invention can best be understood by the following description of the accompanying drawings as follows.

It is noted that the drawings of the invention are not to scale.

DETAILED DESCRIPTION

Figure 1:
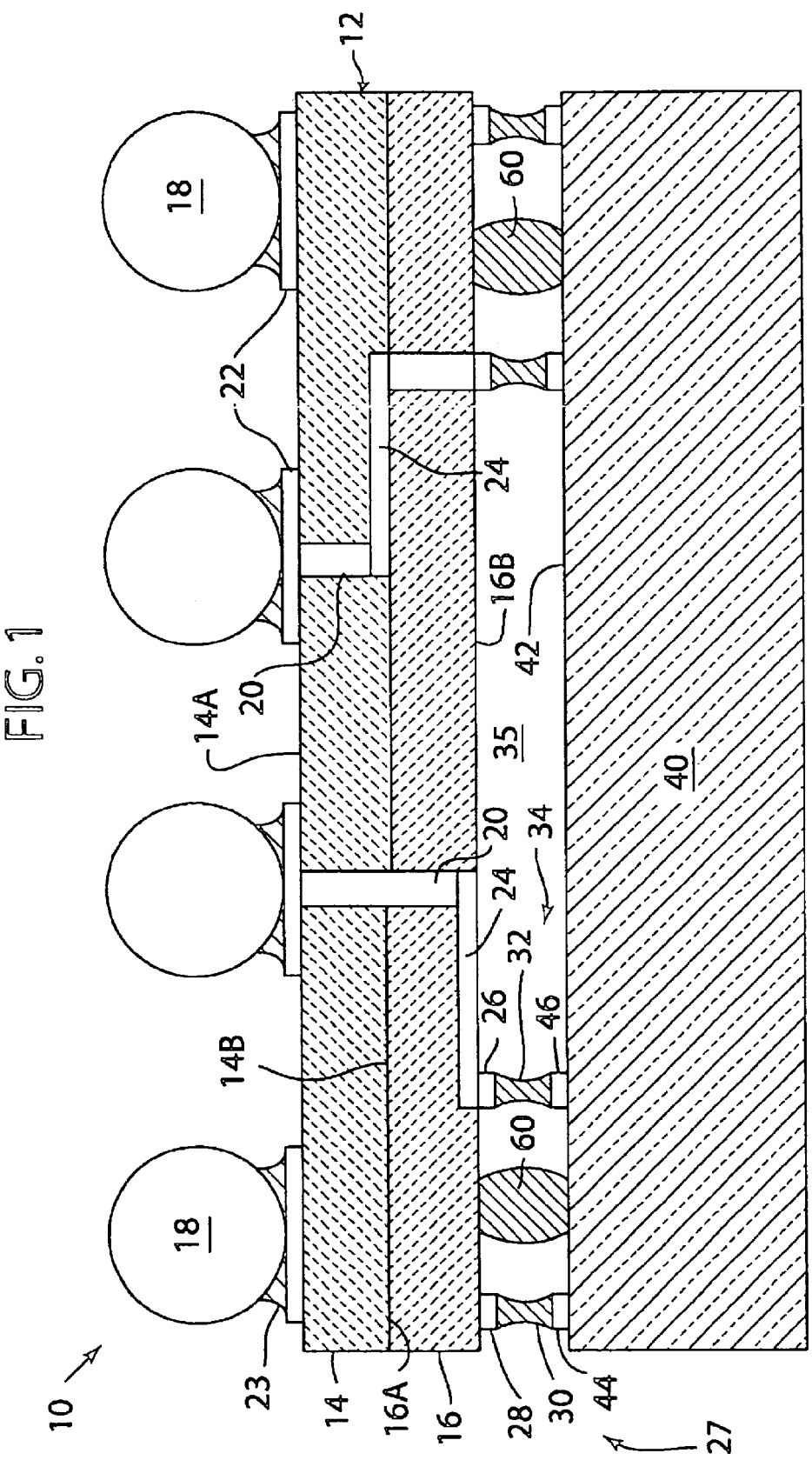
FIG. 1 is a side cross-sectional view of a micro-machined semiconductor package according to the present invention.
Figure 2:
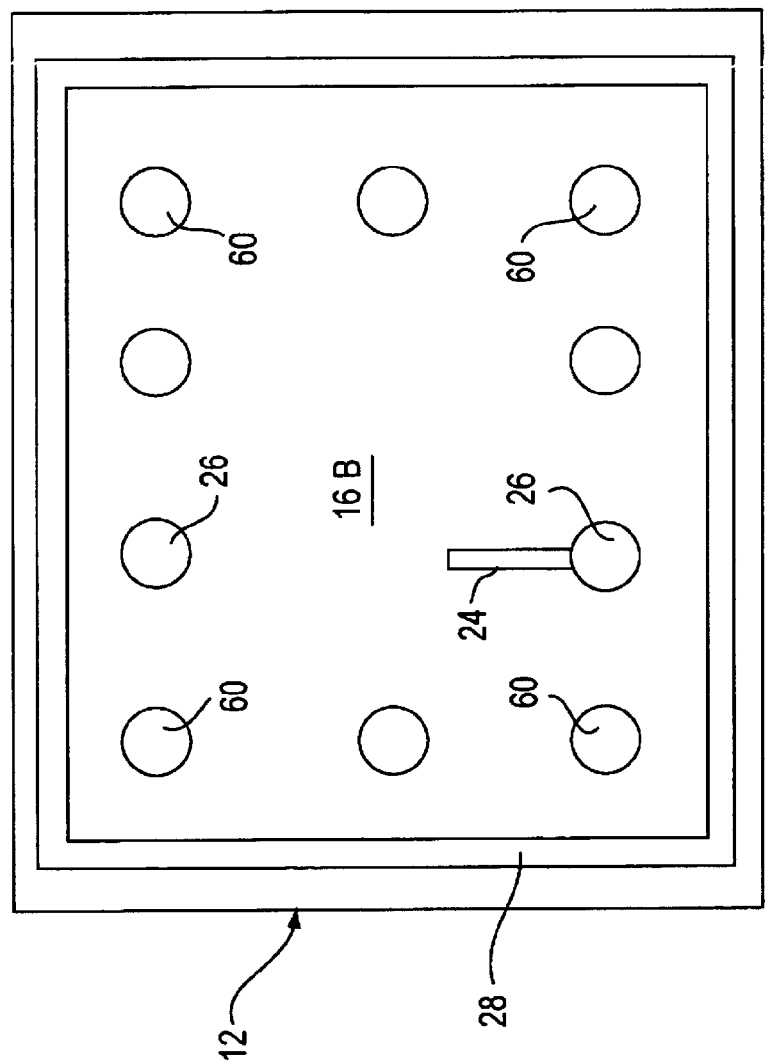
FIG. 2 is a top view of a low temperature co-fired ceramic substrate.
Figure 3:
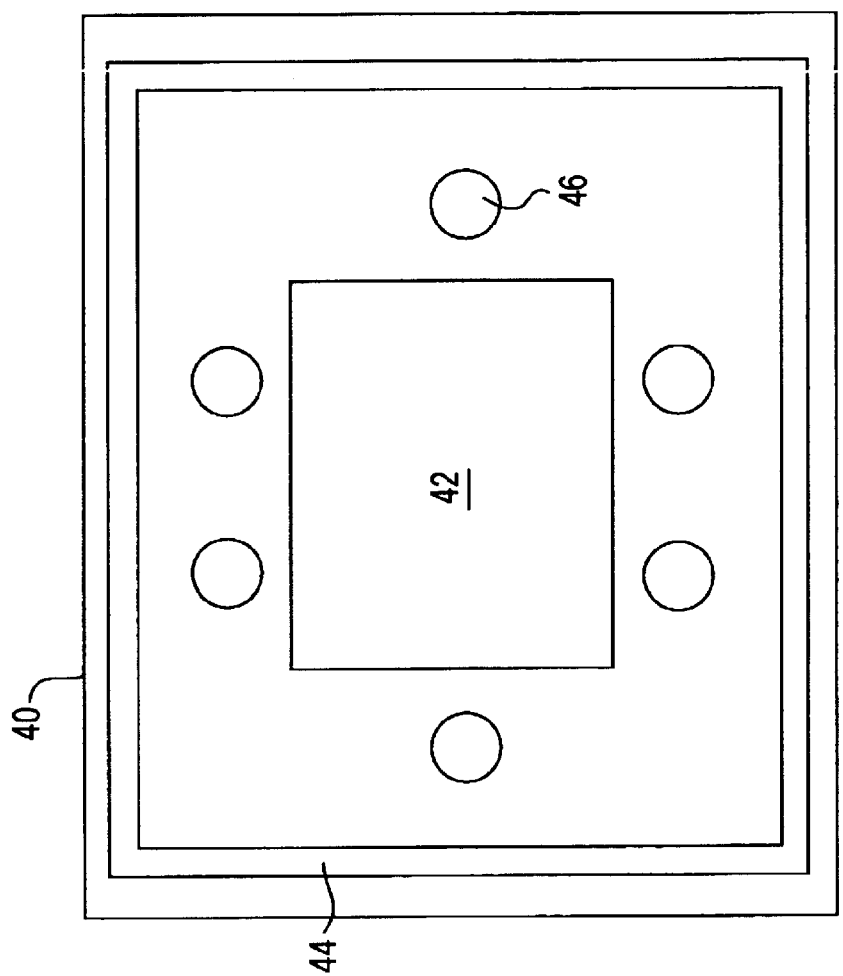
FIG. 3 is a top view of a micro-machined semiconductor device.

Referring to FIGS. 1, 2 and 3, a package for micro-machined semiconductors 10 is shown. A first and second low temperature co-fired ceramic (LTCC) layers 14 and 16, respectively are shown stacked on top of each other. Ceramic layers 14 and 16 form a ceramic substrate or assembly 12. LTCC layers 14 and 16 are conventional LTCC tapes that are commercially available and well known in the art. Layers 14 and 16 have top surfaces 14A, 16A and bottom surfaces 14B, 16B. Layers 14 and 16 have cylindrical vias 20 that contain an electrically conductive material. The vias are punched in the LTCC material in the green state and then screen filled with a commercially available conventional thick film material. Vias 20 extend between surfaces 14A and 16B. Ball pads 22 are located on top surface 14A and are electrically connected to vias 20. Ball pads 22 are formed from conventional thick film conductor materials. Solder spheres 18 are connected to pads 22 by a reflowed solder paste 23 that is screen printed onto pads 22. Solder spheres 18 are used to electrically connect to another electrical circuit (not shown) that typically would be on an external printed circuit board (not shown). Conductor lines 24 are located on bottom surfaces 14B and 16B and are used to route an electrical signal between vias 20 in layers 14 and 16. Conductor lines 24 are formed from conventional thick film conductor materials.

The vias 20 can be stacked on top of each other or may be staggered depending upon which configuration would give optimal wiring density. If the vias are stacked on top of each other, they become electrically and mechanically connected to each other during processing A seal 27 is formed by a metal ring 28, solder 30 and metal ring 44. Metal ring 28 is located around the outer perimeter or peripheral edge of substrate 12 on bottom surface 16B. Metal ring 28 is a screen printed thick film conductor. Metal ring 44 is located on semiconductor 40 and is deposited using standard semiconductor manufacturing processes. Solder 30 is a reflowed solder paste that is located between ring 28 and ring 44. Seal 27 is a hermetic seal. The solder 30 can be screen printed solder paste or may be electroplated solder.

Similarly, an electrical connection 34 is formed by a pad 26, solder 32 and pad 46. Pad 26 is located on bottom surface 16B and is a screen printed thick film conductor. Pad 46 is located on semiconductor 40 and is deposited using standard semiconductor manufacturing processes. Solder 32 is a reflowed solder paste that is located between pad 26 and pad 46. Solder 32 can also be electroplated solder.

A micro-machined semiconductor device (MEMS) or die 40 has an active micro-machined area 42 located in the center of the die. Area 42 moves during operation of semiconductor device 40 and must not be constrained or touched by external devices if it is to function properly. Semiconductor device 40 has a die side metal ring 44 located around its outer periphery and several pads 46. Micro-machined semiconductors devices (MEMS) are used to obtain information in electrical signal form about mechanical forces or movements. Examples of MEMS are devices for sensing tilt, acceleration, strain and pressure. Micro-machined semiconductors devices (MEMS) are commercially available from Silicon Designs Inc. and LucasNova Sensor, for example.

A rigid support 60 is located between MEMS device 40 and bottom surface 16B. Support 60 is attached to bottom surface 16B. Support 60 is formed from a gold wire bond bump or a wire bond bump of a gold-palladium alloy. These wires are commercially available from Tanaka Denshi Corporation and American Fine Wire Corporation. Support 60 is formed by placing a ball formed at the tip of the wire on surface 16B with a ball bonding capillary and then applying pressure and ultrasonic energy to the wire bump and then breaking off the wire leaving support 60. Support 60 is formed using an ultrasonic ball bonding machine that is commercially available from several supplies such as F+K Delvotec, Panasonic and Kulicke and Sofa Corporations. Support 60 allows for an airgap 35 to remain above active area 42 after assembly of semiconductor package 10. The airgap typically has a minimum dimension of 20 microns. Support 60 prevents the MEMS device 40 from collapsing down onto surface 16B of substrate 12 during the solder reflow operation when substrate 12 is joined to MEMS device 40.

Figure 4:
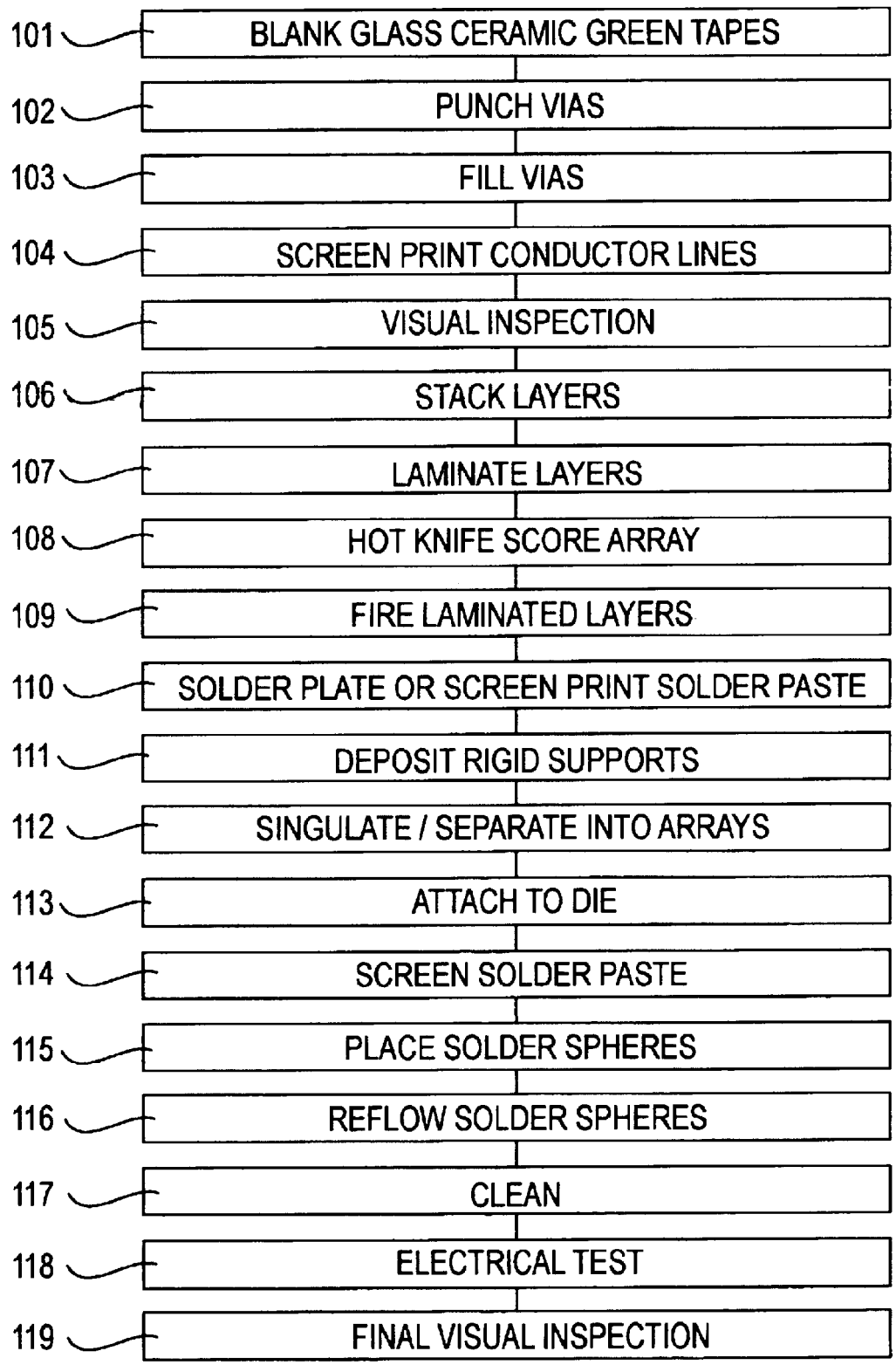
FIG. 4 is a flowchart of a manufacturing process for a micro-machined semiconductor package.

Micro-machined semiconductor package 10 is assembled as follows: Referring to FIG. 4, a flow chart of the manufacturing process for the package for micro-machined semiconductors is shown. The first step 101 is to punch the overall shape for layers 14 and 16 out of a low temperature co-fired ceramic green tape. At step 102, vias 20 are punched in LTCC layers 14 and 16 while each of them are in the green state. At step 103, vias 20 are filled with an electrically conductive material such as a gold, or silver/palladium thick film paste. At step 104, pads 22 and 26, circuit lines 24, and metal ring 28 are screened onto the ceramic layers. At step 105, ceramic layers 14 and 16 are inspected for defects. At step 106, ceramic substrates 14 and 16 are then stacked on top of each other to form ceramic substrate or assembly 12. At step 107, assembly 12 is laminated under pressure. At step 108, assembly 12 is scored using a hot knife into individual pieces to be snapped apart later. At step 109, ceramic assembly 12 is fired in an oven at approximately 850 degrees centigrade. At step 110, a high temperature solder is either electroplated or screen printed with a solder paste onto pads 26 and ring 28. The high temperature solder preferably is 95% lead and 5% tin.

At step 111, rigid supports are placed on surface 16B by ultrasonic welding. At step 112, the ceramic assembly is singulated into individual pieces or packages. At step 113, the micro-machined semiconductor device 40 is placed onto the ceramic assembly 12 and processed through a reflow furnace to join device 40 to assembly 12. At the same time, solder 30 and 32 reflows. This forms a hermetic seal for the micro-machined semiconductor device.

At step 114, a low temperature solder is screen printed with a solder paste onto pads 22. The low temperature solder preferably is 63% lead and 37% tin. Next, at step 115, solder spheres 18 are placed onto ball pads 22. At step 116, the substrate is then processed through a reflow furnace to join the spheres 18 to pads 22. At step 117, package 10 is cleaned with a solvent. At step 118, package 10 is electrically tested. At step 119, package 10 is given a final visual inspection.

The LTCC structure of the present invention provides a solution to both hermetically sealing of the die surface as well as offering a routing medium to allow for attachment of the semiconductor chip. LTCC materials are suitable for this approach because they demonstrate good mechanical and chemical stability, good thermal conductivity and a coefficient of linear expansion close to that of silicon. In addition, the LTCC materials consisting of glass and ceramic demonstrates excellent flatness and can utilize a low resistivity thick film conductor material such as Au, Ag, and/or PdAg. The rigid support 60 keeps the active area of the MEMS device away from the substrate during and after assembly.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A semiconductor package comprising:
   a planar low temperature co-fired ceramic substrate having a first and second layer mounted adjacent each other, the first layer having a first surface and the second layer having a second surface,
   a micro-machined semiconductor device located adjacent the first surface, the micro-machined semiconductor device having a plurality of first pads and an active central area;
   a plurality of ball pads located on the second surface;
   a plurality of second pads located on the first surface;
   a plurality of vias, extending through the substrate between the first and second surfaces, the vias connected to the ball pads and to the first pads;
   a reflowed solder joint located between the first and second pads for electrically connecting the substrate to the semiconductor device, the reflowed solder joint formed from a first reflowed solder paste;
   a solder seal ring, located between the micro-machined semiconductor device and the first surface around an outer perimeter of the substrate for making a hermetic seal between the micro-machined semiconductor device and the substrate;

a plurality of ultrasonically deposited wire bond bumps located between the micro-machined semiconductor device and the first surface for supporting the micro-machined semiconductor device during assembly and preventing the micro-machined semiconductor device from contacting the first surface during reflow of the solder joint, the wire bond bumps further spacing the micro-machined semiconductor device from the first surface, the wire bond bumps further arranged around the active area, the wire bond bumps formed from a metal;

a plurality of solder spheres mounted to the ball pads by a second reflowed solder paste; and wherein the substrate does not have a cavity.

2. The semiconductor package according to claim 1, wherein a plurality of circuit lines are located on the first surface, the circuit lines connected between the vias and the second pads.

3. The semiconductor package according to claim 1, wherein the wire bond bumps are formed from either gold or an alloy of gold.

* * * * *